United States Patent
Oliaei et al.

(10) Patent No.: US 10,830,816 B2
(45) Date of Patent: Nov. 10, 2020

(54) SINGLE CIRCUIT FAULT DETECTION

(71) Applicant: PANASONIC CORPORATION, Osaka (JP)

(72) Inventors: Omid Oliaei, Sunnyvale, CA (US); Adolfo Giambastiani, San Marco (IT)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/471,539

(22) Filed: Mar. 28, 2017

(65) Prior Publication Data

US 2018/0284188 A1    Oct. 4, 2018

(51) Int. Cl.
*G01R 31/3183*    (2006.01)
*G06F 11/25*    (2006.01)
*G01R 31/3181*    (2006.01)

(52) U.S. Cl.
CPC ..... *G01R 31/3183* (2013.01); *G01R 31/3181* (2013.01); *G06F 11/25* (2013.01)

(58) Field of Classification Search
CPC .............................. G01R 31/3183; G06F 11/25
See application file for complete search history.

(56) References Cited

U.S. PATENT DOCUMENTS

| | | | | |
|---|---|---|---|---|
| 6,092,217 A | * | 7/2000 | Kanekawa | G05B 9/03 714/11 |
| 6,253,350 B1 | * | 6/2001 | Durham | G01R 31/3004 326/121 |
| 2014/0019818 A1 | * | 1/2014 | Jindal | G06F 21/556 714/724 |

OTHER PUBLICATIONS

English translation of International Search Report and Written Opinion issued in International Patent Application No. PCT/US2018/024563, dated Jul. 9, 2018.

* cited by examiner

*Primary Examiner* — Thien Nguyen
(74) *Attorney, Agent, or Firm* — McDermott Will & Emery LLP

(57) ABSTRACT

A fault detection system on a circuit can detect a fault on the same circuit without using a duplicate circuit. A test signal can be generated based on an input signal, and the input signal and test signal can be sent through the circuit and the resulting signals can be compared to determine if any fault is present. In an embodiment, a function can be applied to bits of the input signal and bits of the test signal such that when the signals are compared after passing through the processing block that is to be tested, if the variation between the signals is above a predetermined amount, it can be determined that a fault has occurred. In other embodiments, a first function can be applied to the input signal, and a second function can be applied to the test signal, and the resulting outputs can be compared.

22 Claims, 6 Drawing Sheets

SINGLE CIRCUIT FAULT DETECTION

TECHNICAL FIELD

The subject disclosure relates to a fault detection system.

BACKGROUND

Fault detection circuits are used to determine whether there are faults, such as short circuits, faulty processors and/or faulty circuit components. Other faults can include stuck-at-fault, bridging fault, transistor fault or open faults, flipping logic states due to radiation which may eventually cause a functionality fault. Traditionally full coverage is achieved by fault detection circuits that use duplicate circuits in order to compare the resulting circuit outputs. If the difference between the two circuit outputs is above a predefined threshold, it can be determined that a fault has occurred. These duplicate circuits are expensive however, both in terms of cost, and in silicon area. Alternative techniques are based on insertion of a known test signal but they are either slow in detecting (long detection time) and/or cannot achieve 100% logic fault detection.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented layer.

In a non-limiting example, a fault detection apparatus can comprise a signal generator which generates a test signal based on the input signal itself and applies the test signal to a circuit associated with the input signal. The device can also include a function block that applies a first function to the test signal and a second function to the input signal, resulting in a first signal and a second signal respectively wherein the second function is based on the first function. The device can also include a fault detection block that receives the first signal and the second signal after the first signal and the second signal have passed through a process block that is to be tested and compares the first signal and second signal to determine whether the process block has a fault.

In another non-limiting example, a fault detection method can comprise applying a test signal to a circuit, wherein the test signal is derived from an input signal that has been applied to the circuit. The method can also include applying the test signal and the input signal to a processing block. The method can also include in response to receiving the test signal and input signal after passage through the process block, determining that the process block contains a fault in response to a sum of the bits of the test signal and input signal not equaling zero.

In yet another non-limiting example, a fault detect system can comprise a memory to store computer executable instructions and a processor to execute the computer executable instructions to perform operations. The operations can include generating a test signal based on an input signal and applying the test signal to a program function associated with the input signal. The operations can also include applying a first function to the test signal and a second function to the input signal, resulting in a first signal and a second signal respectively, wherein the first function is based on the second function. The operations can also include in response to receiving the first signal and the second signal after passing through a process block, determining that the process block has a fault based on a sum of the first signal and the second signal not equaling zero.

The following description and the drawings contain certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION

Overview

Figure 1:
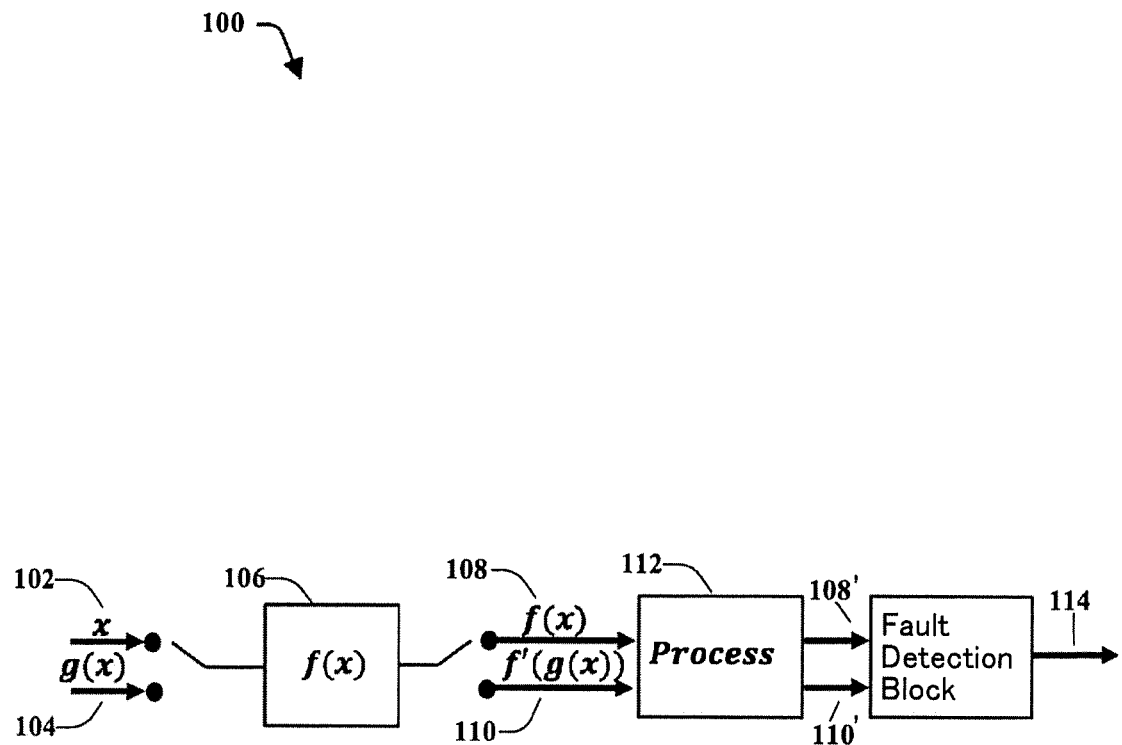
FIG. 1 depicts a non-limiting block diagram of a fault detection system according to various non-limiting aspects of the subject disclosure.

While a brief overview is provided, certain aspects of the subject disclosure are described or depicted herein for the purposes of illustration and not limitation. Thus, variations of the disclosed embodiments as suggested by the disclosed apparatuses, systems and methodologies are intended to be encompassed within the scope of the subject matter disclosed herein. For example, the various embodiments of the apparatuses, techniques and methods of the subject disclosure are described in the context of MEMs sensors and fault detection systems on sensors. In particular, sensor data acquired from MEMs sensors can be processed using a series of processing components and the fault detection apparatus disclosed herein can relate to fault detection of the sensor data signals. However, as further detailed below, various exemplary implementations can be applied to fault detection on other types of circuits and on other types of signals. The principals disclosed herein can also apply to fault detection in software processing, detecting faults in programming logic without departing from the subject matter described herein.

As used herein, the terms MEMS sensor, MEMS accelerometer, MEMS gyroscope, MEMS inertial sensor, MEMS acoustic sensor(s), MEMS audio sensor(s), and the like are used interchangeably unless context warrants a particular distinction among such terms. For instance, the terms can refer to MEMS devices or components that can measure acceleration, rate of rotation, a proximity, determine acoustic characteristics, generate acoustic signals, or the like.

Additionally, terms such as "at the same time," "common time," "simultaneous," "simultaneously," "concurrently," "substantially simultaneously," "immediate," and the like are employed interchangeably throughout, unless context warrants particular distinctions among the terms. It should be appreciated that such terms can refer to times relative to each other and may not refer to an exactly simultaneously action(s). For example, system limitations (e.g., download speed, processor speed, memory access speed, etc.) can account for delays or unsynchronized actions. In other embodiments, such terms can refer to acts or actions occurring within a period that does not exceed a defined threshold amount of time.

Various embodiments provide for a fault detection system on a circuit that detects faults on the same circuit without using a duplicate circuit. A test signal can be generated based on an input signal, and the input signal and test signal can be sent through the circuit and the resulting signals can be compared to determine if any fault is present. In an embodiment, a function can be applied to bits of the input signal and bits of the test signal such that when the signals are compared after passing through the processing block that is to be tested, if the variation between the signals is above a predetermined amount, it can be determined that a fault has occurred. In other embodiments, a first function can be applied to the input signal, and a second function can be applied to the test signal, and the resulting outputs can be compared. In yet other embodiments, the input signal and test signal can be time multiplexed to generate a second output signal that can be used to determine the existence of a fault.

Various other configurations or arrangements are described herein. It is noted that the various embodiments can include other components and/or functionality. It is further noted that the various embodiments can be included in larger systems, including, smart televisions, smart phones or other cellular phones, wearables (e.g., watches, headphones, etc.), tablet computers, electronic reader devices (i.e., e-readers), laptop computers, desktop computers, monitors, digital recording devices, appliances, home electronics, handheld gaming devices, remote controllers (e.g., video game controllers, television controllers, etc.), automotive devices, personal electronic equipment, medical devices, industrial systems, cameras, and various other devices or fields.

Exemplary Embodiments

Various aspects or features of the subject disclosure are described with reference to the drawings, wherein like reference numerals are used to refer to like elements throughout. In this specification, numerous specific details are set forth in order to provide a thorough understanding of the subject disclosure. It should be understood, however, that the certain aspects of disclosure may be practiced without these specific details, or with other methods, components, parameters, etc. In other instances, well-known structures and devices are shown in block diagram form to facilitate description and illustration of the various embodiments.

FIG. 1 illustrates an exemplary, non-limiting block diagram 100 of a fault detection system according to various non-limiting aspects of the subject disclosure. In an embodiment, a signal 102 can be applied to a circuit to facilitate one or more functions and/or operations by a process block 112. The process block 112 can include any processor, chip, or hardware logic that performs operations based on an input signal 102. The operations can include executing instructions from a memory, or performing computations, or other operations.

In various embodiments, faults, such as stuck-at-fault, bridging fault, transistor fault or open faults, short circuits, and other faults which may eventually cause functionality breakdown can be detected using a second signal, a test signal 104. In conventional systems, the test signal is applied using a separate circuit that overlaps with the tested circuit at the process block 112 that is to be tested. In the embodiments described herein however, the test signal 104 can be applied to the same circuit, to avoid having to duplicate the circuit and waste silicon area and increased costs.

The test signal 104 can be generated by a signal generator in some embodiments, or can be an altered and/or modified version of the signal 102. This is represented in FIG. 1 as the signal 102 being "x" and the test signal 104 being "g(x)" where the test signal 104 is some function g of x.

The test signal 104 and the signal 102 can each pass through a function block 106 that applies a first function to the primary signal 102 and a second function to the test signal 104, resulting in a modified signal 108 that is a function of x, and a modified test signal 110 that is another function of g of x. The hashmark in the modified test signal 110 can indicate that the functions applied to the signals are different functions. In other embodiments however, the same functions can be applied to both the primary signal 102 and the test signal 104. In other embodiments, the second function applied to the test signal 104 can be an inverse function of the first function applied to the primary signal 102.

It is to be appreciated that while reference is made to the digital circuits herein, the principles are also applicable to analog circuits as well as software functions. For example, the test signal 104 is generated based on the primary signal 102, wherein the digital bits corresponding to the test signal 104 are based on the digital bits representing the primary signal 102. Similarly, the function block 106 performs modifications to the digital bits representing the signal 102 and the test signal 104. For instance, the signal generator or function block 106 can comprise digital logic or a digital adder that can invert the test signal 104 relative to the input signal 102 or can take a 2's complement or a 1's complement of bits of the primary signal 102 and test signal that results in the modified signals 108 and 110. In an analog circuit embodiment, the test signal generator or function block can perform analog transformations of the signals (e.g., inverting, etc) that do not involve modifying digital bits of the signals.

In an embodiment, the modified input signal 108 and the modified test signal 110 can both be passed through the process block 112 and a fault detection system can determine whether a fault 114 has occurred based on the output of the process block 112. It can be determined that the process block 112 has a fault 114 if the output signals 108' and 110' are outside a predetermined value. For instance, the function block 106 can apply the functions to signals 102 and 104 that result in modified signals 108 and 110 such that when the modified signals 108 and 110 pass through the process block 112, the outputs (108', 110') cancel each other out or provide some specific result when added together or combined (e.g., a null value in an exemplary embodiment or another value in other embodiments). For instance, if the digital bits of the output signals 108', 110' are added together and result in a predetermined value, then it can be determined that the process block 112 is functional, without detectable faults. If the value of the comparison is outside a predetermined range however, the fault detection system can determine that the process block 112 has a fault of some variety.

In an embodiment, the functions applied to the input signal 102 and the test signal 104 at 106 can be based on the type of process block 112 or the type of transformation performed in the process block 112 in order to facilitate comparing the test signal 110' to the input signal 108' to determine whether a fault exists. In other embodiments, the fault detection can be altered based on the function applied and the process block 112.

In an embodiment, where the addition of the outputs 108', 110' of signals 108 and 110 after passing through the process block 112 is compared, the determination of whether a fault exists can be based on a range of resulting values. There can be some natural rounding up and down of values through the process block 112, and the predetermined range around the target value can account for the rounding values.

In an embodiment, the test signal 104 can be introduced to the circuit after the input signal 102 is applied to the circuit. A test signal can be sequentially applied to the circuit after every input signal to provide continual testing, or test signals can be applied at various predetermined periods (e.g., every micro-second, millisecond, etc), using a previous input signal as a basis for the test signal. The circuit can contain one or more memories (e.g., FLASH, EEPROM, RAM, DRAM, SRAM, and etc) in order to retain a record of the input signal or the test signal until the corresponding signal is received in order to perform a comparison of the signals.

In other embodiments, the test signal 104 can be applied to the circuit at substantially the same time as the input signal 102, and the signals can be time domain multiplexed, frequency domain multiplexed, or form of multiplexing in order to transmit both the input signal 102 and the test signal 104 at substantially the same time.

In an embodiment, the input signal 102 can be one of many input signals, and there can be a one or more test signals corresponding to one or more of the input signals. The circuit can thus be tested for faults by making comparisons between the plurality of input signals and corresponding test signals.

Figure 2:
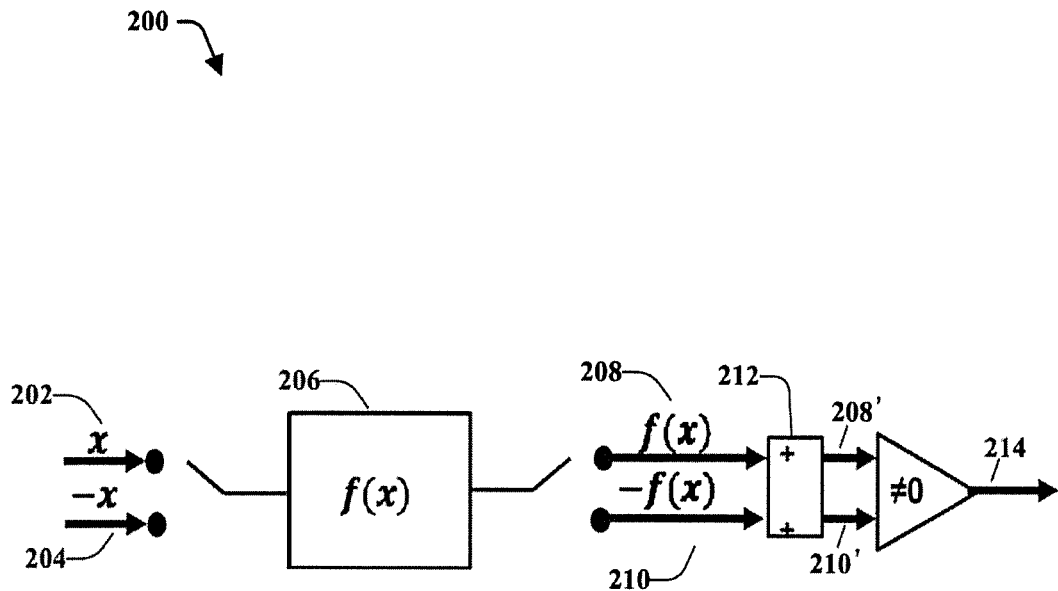
FIG. 2 depicts a non-limiting block diagram of a fault detection system according to various non-limiting aspects of the subject disclosure.

Turning now to FIG. 2, illustrated is a non-limiting block diagram of a fault detection system according to various non-limiting aspects of the subject disclosure.

In the embodiment shown in FIG. 2, the test signal 204 can be an inverse of the input signal 202. The function block 206 can apply the same function to both the input signal 202 and the test signal 204, resulting in a modified input signal 208 that is f(x) and a modified test signal 210 that is −f(x). The function block 206 can comprise digital logic that can invert the test signal 204 relative to the input signal 202 or can take a two's complement or one's complement of bits of the input signal 202 and test signal 204 that results in the modified signals 208 and 210. In an analog circuit embodiment, the test signal generator or function block can perform analog transformations of the signals (e.g., inverting, etc) that do not involve modifying digital bits of signals.

The modified signals 208 and 210 can be compared by digital logic 212 that adds digitalbits of the signal together. If there is no error, the result of the digital logic 212 should result in an output 214 of around 0. The fault detection system can also accept non-zero values as being fault free as long as the non-zero values are within a predetermined range of 0. This predetermined range accounts for levels of acceptable rounding and estimation that may be performed in the circuit. If the values of the output 214 are outside the predetermined range around zero however, the circuit may be determined to have a fault.

In this embodiment shown in FIG. 2, the implementation can be suitable for an odd function, where the result of a function of x is negative for a negative x input, and the result of a function of x is positive for a positive x input. In other embodiments, even functions can be used with different implementations.

As in the embodiment in FIG. 1, the fault detection system 200 can be contained on a single circuit. The test signal 204 can be sequentially applied to the circuit after every input signal to provide continual testing, or test signals can be applied at various predetermined periods (e.g., every micro-second, milli-second, etc), using a previous input signal as a basis for the test signal. The circuit can contain one or more memories (e.g., FLASH, EEPROM, RAM, DRAM, SRAM, and etc) in order to retain a record of the input signal or the test signal until the corresponding signal is received in order to perform a comparison of the signals.

In an embodiment, the input signal 202 can be one of many input signals, and there can be a one or more test signals corresponding to one or more of the input signals. The circuit can thus be tested for faults by making comparisons between the plurality of input signals and corresponding test signals.

Figure 3:
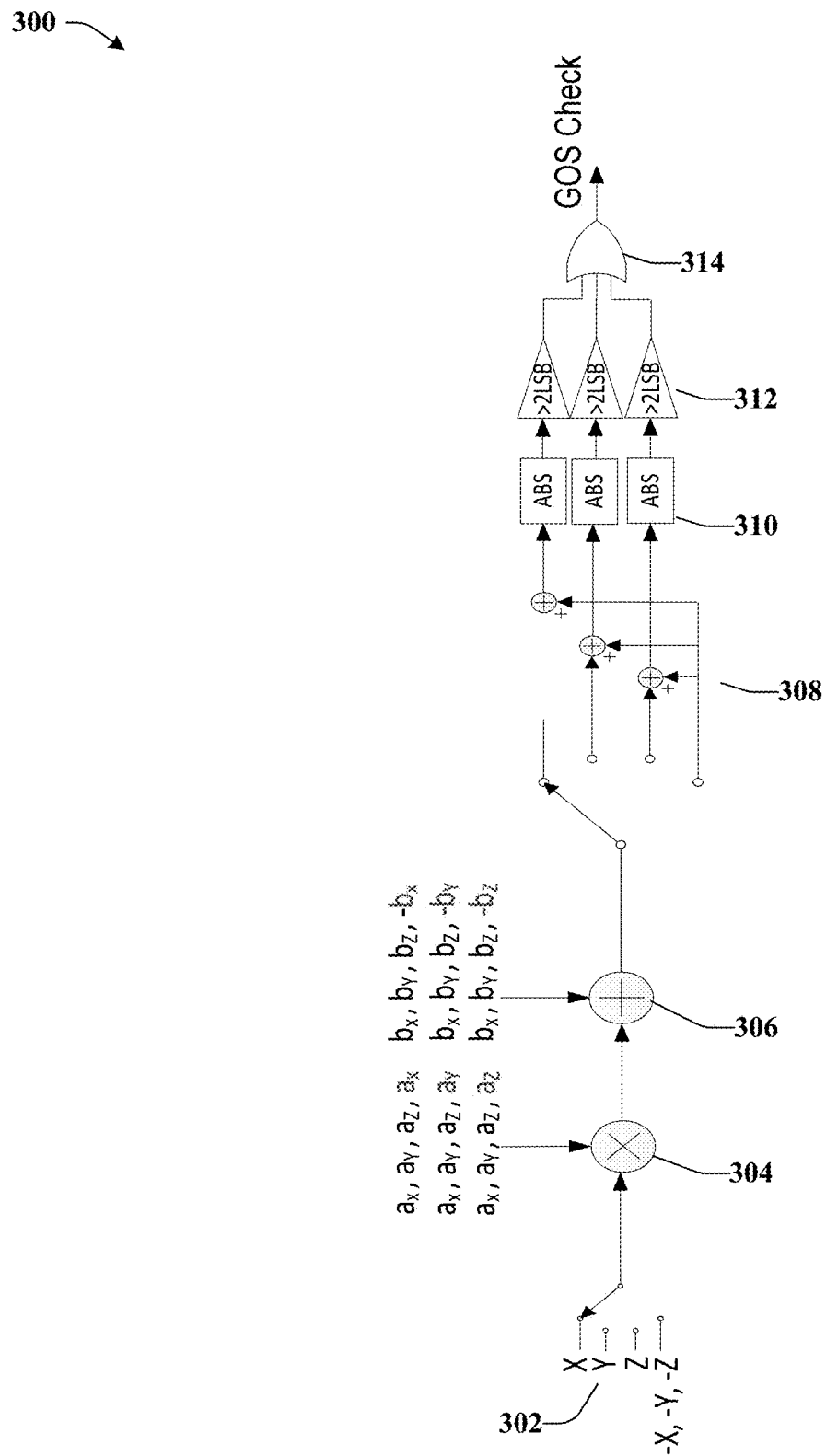
FIG. 3 depicts a non-limiting block diagram of a fault detection system that uses time multiplexing according to various non-limiting aspects of the subject disclosure.

Turning now to FIG. 3, illustrated is a non-limiting block diagram 300 of a fault detection system that uses time multiplexing according to various non-limiting aspects of the subject disclosure. In the embodiment shown herein, there can be multiple inputs at 302 (e.g., X, Y, Z, as well as test signal −X, −Y, and −Z. These inputs and test signals can be multiplexed and one or more functions performed on them at 304 and 306. Then, at 308, the input signals can be compared to the test signals sequentially during extra phases, and their values determined at 310. If the results are greater than a predetermined value, for example 2 least significant bits at 312, it can be determined at 314 that there may be a fault in the circuit.

In an embodiment, the fault detection system disclosed herein performs a function comprising a*x+b that includes fault detection.

Figure 4:
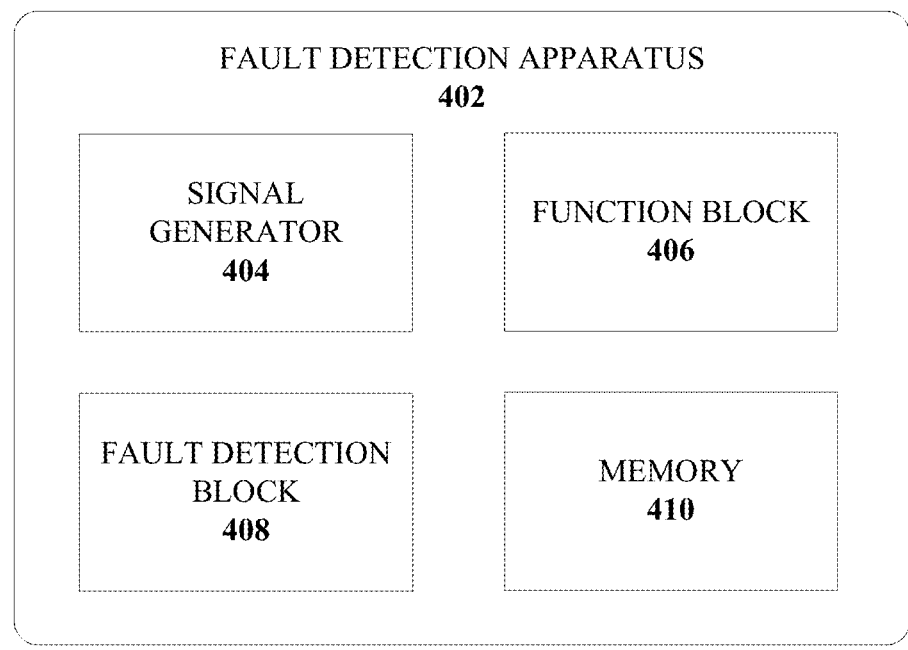
FIG. 4 depicts a non-limiting schematic diagram of a fault detection apparatus according to various non-limiting aspects of the subject disclosure.

Turning now to FIG. 4, illustrated is a non-limiting schematic diagram 400 of a fault detection apparatus 402 according to various non-limiting aspects of the subject disclosure. The fault detection apparatus 402 can include a signal generator 404 that generates a test signal 104204, based on an input signal 102, 202 and applies the test signal 104, 204 to a circuit associated with the input signal 102, 204. See also, FIGS. 1 and 2. A function block 406 can be included that applies a first function to the input signal 102, 202 and a second function to the test signal 104, 204, resulting in a first signal 108, 208 and a second signal 110, 210 respectively wherein the second function is based on the first function. A fault detection block 408 can be included that receives the first signal 108', 208' and the second signal 110', 210' after the first signal and the second signal have passed through a process block that is to be tested and compares the first signal 108', 208' and second signal 110', 210' to determine whether the process block has a fault. A memory 410 can further be included to store information relating to the first signal until the second signal is received.

The signal generator can generate the test signal based on an altered and/or modified version of the input signal. The test signal and the signal can each pass through the function block 406 that applies a first function to the primary signal and a second function to the test signal, resulting in a modified signal that is a function of x, and a modified test signal that is another function of x. In other embodiments however, the function block 406 can apply the same function to both the input signal and the test signal. In other embodiments, the second function applied to the test signal can be an inverse function of the first function applied to the input signal.

It is to be appreciated that while reference is made to the digital circuits herein, the principles are also applicable to analog circuits as well as software functions. For example, the test signal is generated based on the primary signal, wherein the bits of the test signal are based on bits of the primary signal. Similarly, the function block 406 performs modifications to the bits of the signal and the test signal. For instance, the signal generator 404 or function block 406 can comprise digital logic or a digital adder that can invert the test signal relative to the input signal or can take a two's complement or one's complement of bits of the primary signal and test signal that results in the modified signals. In an analog circuit embodiment, the signal generator 404 or function block 406 can perform analog transformations of the signals (e.g., inverting, etc) that do not involve modifying bits of the signals.

In an embodiment, the signal generator 404 can introduce the test signal to the circuit after the input signal is applied to the circuit. A test signal can be applied to the circuit after every input signal to provide continual testing, or test signals can be applied at various predetermined periods (e.g., every micro-second, milli-second, etc), using a previous input signal as a basis for the test signal. The circuit can contain one or more memories (e.g., memory 410) in order to retain a record of the input signal or the test signal until the corresponding signal is received in order to perform a comparison of the signals.

The fault detection block 408 can compare the outputs of the signals after passing through the chip or logic that is to be tested. By comparing the values of the signals the fault detection block 408 can determine that a fault has occurred if the sum of the values is outside a predetermined range around a predetermined value. If the test signal is inverse to the input signal, and the combination of the signals is not zero (or within a predetermined range of zero), then the fault detection block 408 can determine that the chip or logic contains a fault.

Exemplary Methods

Figure 5:
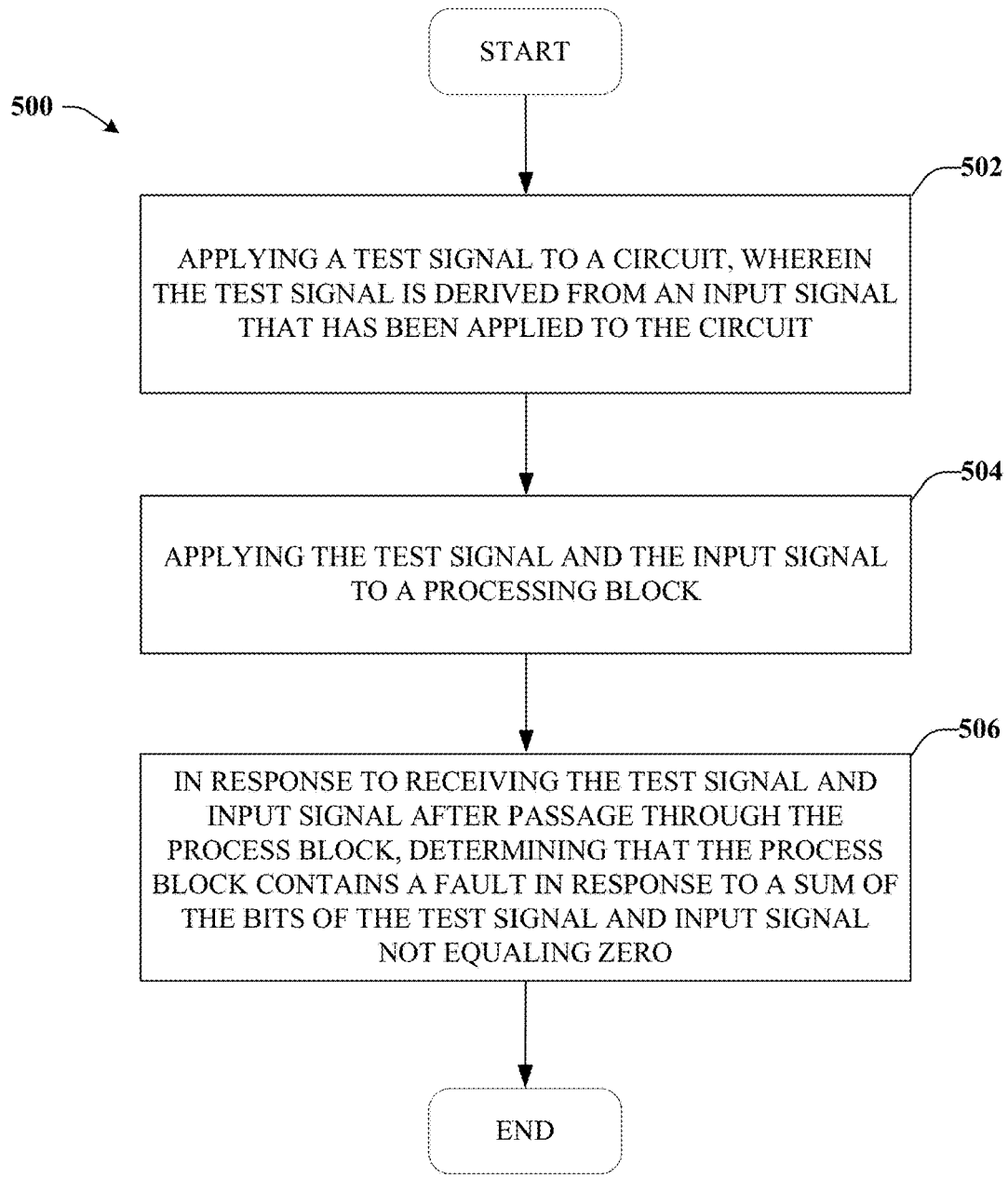
FIG. 5 depicts an exemplary flowchart of non-limiting methods associated with fault detection in a single circuit according to various non-limiting aspects of the disclosed subject matter.

In view of the subject matter described supra, methods that can be implemented in accordance with the subject disclosure will be better appreciated with reference to the flowchart of FIG. 5. While for purposes of simplicity of explanation, the methods are shown and described as a series of blocks, it is to be understood and appreciated that such illustrations or corresponding descriptions are not limited by the order of the blocks, as some blocks may occur in different orders and/or concurrently with other blocks from what is depicted and described herein. Any non-sequential, or branched, flow illustrated via a flowchart should be understood to indicate that various other branches, flow paths, and orders of the blocks, can be implemented which achieve the same or a similar result. Moreover, not all illustrated blocks may be required to implement the methods described hereinafter.

FIG. 5 depicts an exemplary flowchart of non-limiting methods associated with fault detection in a single circuit according to various non-limiting aspects of the disclosed subject matter. As a non-limiting example, exemplary method 500 can facilitate determining whether a circuit has a fault in a chip or digital logic based on a test signal that is applied to the same circuit as the input signal. The method 500 can start at 502 where the method includes applying a test signal to a circuit, wherein the test signal is derived from an input signal that has been applied to the circuit.

At 504, the method includes applying the test signal and the input signal to a processing block.

At 506, the method includes in response to receiving the test signal and input signal after passage through the process block, determining that the process block contains a fault in response to a sum of the bits of the test signal and input signal not equaling zero.

Exemplary Operating Environment

The systems and processes described herein can be embodied within hardware, such as a single integrated circuit (IC) chip, multiple ICs, an ASIC, or the like. Further, the order in which some or all of the process blocks appear in each process should not be deemed limiting. Rather, it should be understood that some of the process blocks can be executed in a variety of orders, not all of which may be explicitly illustrated herein.

Figure 6:
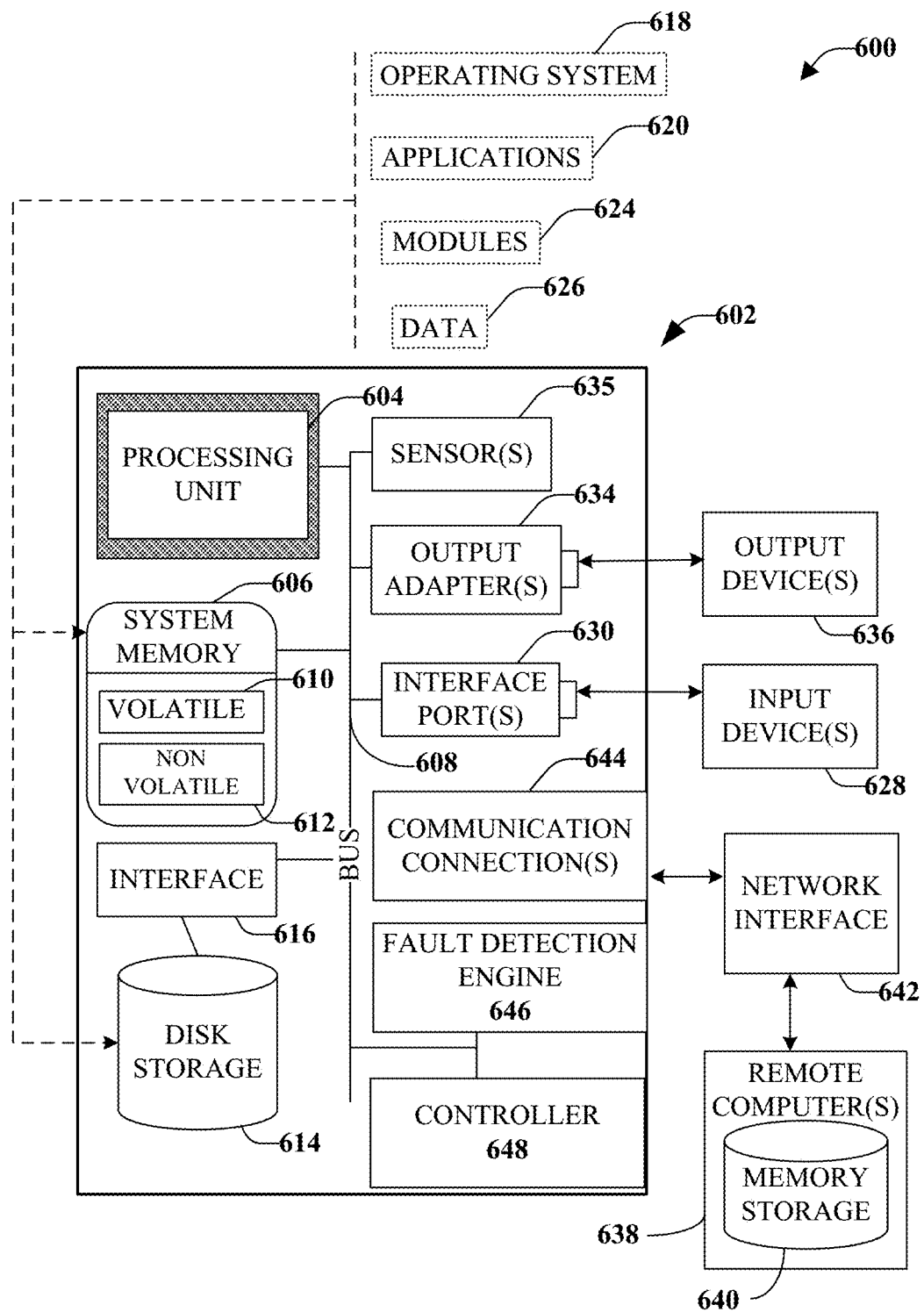
FIG. 6 depicts an example schematic block diagram for a computing environment in accordance with certain embodiments of this disclosure.

With reference to FIG. 6, a suitable environment 600 for implementing various aspects of the claimed subject matter includes a computer 602. The computer 602 includes a processing unit 604, a system memory 606, sensor(s) 635, and a system bus 608. The system bus 608 couples system components including, but not limited to, the system memory 606 to the processing unit 604. The processing unit 604 can be any of various available processors. Dual microprocessors and other multiprocessor architectures also can be employed as the processing unit 604.

The system bus 608 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 606 includes volatile memory 610 and non-volatile memory 612. The basic input/output system (BIOS), containing the basic routines to transfer information between elements within the computer 602, such as during start-up, is stored in non-volatile memory 612. In an embodiment, the processing unit 604 and or system memory can process and/or receive a digital signal received from the sensor 635. In other embodiments, the processing unit 604 can perform sampling on an analog signal received from the sensor 635 (e.g., sensor 308) using a clock signal received from the sensor 635. By way of illustration, and not limitation, non-volatile memory 612 can include read only memory (ROM), programmable ROM (PROM), electrically programmable ROM (EPROM), electrically erasable programmable ROM (EEPROM), or flash memory. Volatile memory 610 includes random access memory (RAM), which acts as external cache memory. According to present aspects, the volatile memory may store the write operation retry logic (not shown in FIG. 6) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ES-DRAM).

Computer 602 may also include removable/non-removable, volatile/non-volatile computer storage medium. FIG. 6 illustrates, for example, disk storage 614. Disk storage 614 includes, but is not limited to, devices like a magnetic disk drive, solid state disk (SSD) floppy disk drive, tape drive, Jaz drive, Zip drive, LS-100 drive, flash memory card, or memory stick. In addition, disk storage 614 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 614 to the system bus 608, a removable or non-removable interface is typically used, such as interface 616. It is appreciated that storage devices 614 can store information related to a user. Such information might be stored at or provided to a server or to an application running on a user device. In one embodiment, the user can be notified (e.g., by way of output device(s) 636) of the types of information that are stored to disk storage 614 and/or transmitted to the server or application. The user can be provided the opportunity to control having such information collected and/or shared with the server or application (e.g., by way of input from input device(s) 628).

It is to be appreciated that FIG. 6 describes software that acts as an intermediary between users and the basic computer resources described in the suitable operating environment 600. Such software includes an operating system 618. Operating system 618, which can be stored on disk storage 614, acts to control and allocate resources of the computer system 602. Applications 620 take advantage of the management of resources by operating system 618 through program modules 624, and program data 626, such as the boot/shutdown transaction table and the like, stored either in system memory 606 or on disk storage 614. It is to be appreciated that the claimed subject matter can be implemented with various operating systems or combinations of operating systems.

A user enters commands or information into the computer 602 through input device(s) 628. Input devices 628 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 604 through the system bus 608 via interface port(s) 630. Interface port(s) 630 include, for example, a serial port, a parallel port, a game port, and a universal serial bus (USB). Output device(s) 636 use some of the same type of ports as input device(s) 628. Thus, for example, a USB port may be used to provide input to computer 602 and to output information from computer 602 to an output device 636. Output adapter 634 is provided to illustrate that there are some output devices 636 like monitors, speakers, and printers, among other output devices 636, which require special adapters. The output adapters 634 include, by way of illustration and not limitation, video and sound cards that provide a means of connection between the output device 636 and the system bus 608. It should be noted that other devices and/or systems of devices provide both input and output capabilities such as remote computer(s) 638.

Computer 602 can operate in a networked environment using logical connections to one or more remote computers, such as remote computer(s) 638. The remote computer(s) 638 can be a personal computer, a server, a router, a network PC, a workstation, a microprocessor based appliance, a peer device, a smart phone, a tablet, or other network node, and typically includes many of the elements described relative to computer 602. For purposes of brevity, only a memory storage device 640 is illustrated with remote computer(s) 638. Remote computer(s) 638 is logically connected to computer 602 through a network interface 642 and then connected via communication connection(s) 644. Network interface 642 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 644 refers to the hardware/ software employed to connect the network interface 642 to the bus 608. While communication connection 644 is shown for illustrative clarity inside computer 602, it can also be external to computer 602. The hardware/software necessary for connection to the network interface 642 includes, for exemplary purposes only, internal and external technologies such as, modems including regular telephone grade modems, cable modems and DSL modems, ISDN adapters, and wired and wireless Ethernet cards, hubs, and routers.

Computer 602 can also include a fault detection engine 646 and controller 648 that perform the functions associated with the fault detection apparatus 402 described above with reference to FIG. 4.

The illustrated aspects of the disclosure may also be practiced in distributed computing environments where certain tasks are performed by remote processing devices that are linked through a communications network. In a distributed computing environment, program modules can be located in both local and remote memory storage devices.

It is to be appreciated that various components described herein can include electrical circuit(s) that can include components and circuitry elements of suitable value in order to implement the embodiments of the subject innovation(s). Furthermore, it can be appreciated that many of the various components can be implemented on one or more integrated circuit (IC) chips. For example, in one embodiment, a set of components can be implemented in a single IC chip. In other embodiments, one or more of respective components are fabricated or implemented on separate IC chips.

What has been described above includes examples of the embodiments of the present disclosure. It is, of course, not possible to describe every conceivable combination of components or methodologies for purposes of describing the claimed subject matter, but it is to be appreciated that many further combinations and permutations of the subject innovation are possible. Accordingly, the claimed subject matter is intended to embrace all such alterations, modifications, and variations that fall within the spirit and scope of the appended claims. Moreover, the above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. Moreover, use of the term "an embodiment" or "one embodiment" throughout is not intended to mean the same embodiment unless specifically described as such.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned diagrams/systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A fault detection apparatus for testing a process block, comprising:
    a signal generator which generates a test signal based on an input signal and applies the test signal to a function block associated with the input signal;
    the function block configured to:
        generate a first signal only from the test signal, without referring to the input signal, by applying a first function to the test signal,
        generate a second signal only from the input signal, without referring to the test signal, by applying a second function to the input signal,
        applying the first signal and the second signal to the process block to be tested, wherein the second function is based on the first function; and
    a fault detection block that:
        is different from the process block to be tested, receives a third signal and a fourth signal corresponding to the first signal and the second signal, respectively, which have passed through the process block to be tested, and
        compares the third signal and fourth signal to determine whether the process block has a fault.

2. The fault detection apparatus of claim 1, wherein the fault detection block determines that no fault has occurred if a result of a comparison of the third signal and the fourth signal results in zero.

3. The fault detection apparatus of claim 1, wherein the fault detection block determines that no fault has occurred if a result of an addition of the third signal and the fourth signal results in a sum equal to a predetermined range of numbers.

4. The fault detection apparatus of claim 1, wherein the fault detection block determines that a fault has occurred if a result of an addition of the third signal and the fourth signal results in a sum outside of a predetermined range.

5. The fault detection apparatus of claim 1, wherein the function block comprises a digital logic that inverts the second signal relative to the first signal.

6. The fault detection apparatus of claim 5, wherein the digital logic takes a 2's complement of the input signal to generate the second signal.

7. The fault detection apparatus of claim 1, wherein the function block comprises a digital logic that takes a 1's complement of the input signal to generate the second signal.

8. The fault detection apparatus of claim 1, wherein the test signal is derived from the input signal.

9. The fault detection apparatus of claim 1, wherein the signal generator can generate respective test signals corresponding to a plurality of input signals from multiple inputs.

10. The fault detection apparatus of claim 1, further comprising a memory that stores information relating to the first signal until the second signal is received.

11. The fault detection apparatus of claim 1, wherein the test signal and the input signal are time-multiplexed.

12. The fault detection apparatus of claim 1, wherein the signal generator applies the test signal to the function block sequentially after the input signal is applied to the the function block.

13. A fault detection method to test a process block, comprising:
    generating a test signal based on an input signal;
    applying the test signal to a function block associated with the input signal;
    generating, by the function block, a first signal only from the test signal, without referring to the input signal, by applying a first function to the test signal;
    generating, by the function block, a second signal only from the input signal, without referring to the test signal, by applying a second function to the input signal, wherein the second function is based on the first function;
    applying the first signal and the second signal to the process block; and
    in response to receiving a third signal and fourth signal corresponding to the first signal and the second signal that have passed through the process block, determining, by a fault detection block different from the process block, that the process block contains a fault in response to a sum of bits of the third signal and fourth signal not equaling zero.

14. The fault detection method of claim 13, wherein the determining that the process block contains a fault further comprises determining that the sum of the bits are outside of a predetermined range around zero.

15. The fault detection method of claim 13, wherein the applying, by the function block, the first function and the second function comprising:
    inverting the test signal relative to the input signal by taking a 2's complement of the input signal with a digital adder.

16. The fault detection method of claim 13, wherein the applying, by the function block, the first function and the second function comprising:
    inverting the test signal relative to the input signal by taking a 1's complement of the input signal.

17. The fault detection method of claim 13, further comprising:
    time-multiplexing the input signal and test signal.

18. The fault detection method of claim 13, further comprising:
    applying the test signal to the function block sequentially after the input signal is applied to the function block.

19. A fault detect system, comprising:
    a non-transitory memory to store computer executable instructions; and
    a processor to execute the computer executable instructions to perform operations, comprising:
        generating a test signal based on an input signal and applying the test signal to a program function associated with the input signal;
        generating a first signal only from the test signal, without referring to the input signal, by applying a first function to the test signal and generating a second signal only from the input signal, without referring to the test signal, by applying a second function to the input signal, wherein the first function is based on the second function;
        applying the first signal and the second signal to a process block; and
        in response to receiving a third signal and a fourth signal corresponding to the first signal and the second signal, respectively, which have passed through the process block, determining that the process block has a fault based on a sum of the first signal and the second signal not equaling zero.

20. The fault detection system of claim 19, wherein the sum of the first signal and the second signal is outside of a predetermined range around zero.

21. The fault detection system of claim 19, wherein the applying the first function and the second function comprises inverting the second signal relative to the first signal via a digital logic that takes a 1's complement or a 2's complement of the input signal.

22. The fault detection system of claim 19, wherein the operations further comprise:
    generating a plurality of test signals based on respective input signals received from multiple inputs.

* * * * *